United States Patent
Tomita et al.

(10) Patent No.: US 12,395,754 B2
(45) Date of Patent: Aug. 19, 2025

(54) MINIMAL REPEATING UNIT HAVING REDUCED BLOOMING EFFECT OF CLEAR PIXELS

(71) Applicant: OmniVision Technologies, Inc., Santa Clara, CA (US)

(72) Inventors: Ryuji Tomita, Yokohama (JP); Shunsuke Suzuki, Tokyo (JP)

(73) Assignee: OmniVision Technologies, Inc., Santa Clara, CA (US)

( * ) Notice: Subject to any disclaimer, the term of this patent is extended or adjusted under 35 U.S.C. 154(b) by 109 days.

(21) Appl. No.: 18/502,159

(22) Filed: Nov. 6, 2023

(65) Prior Publication Data

US 2025/0150729 A1    May 8, 2025

(51) Int. Cl.
*H04N 25/621*  (2023.01)
*H04N 25/11*   (2023.01)
*H10F 39/18*   (2025.01)

(52) U.S. Cl.
CPC ........... *H04N 25/621* (2023.01); *H04N 25/11* (2023.01); *H10F 39/182* (2025.01); *H10F 39/186* (2025.01)

(58) Field of Classification Search
CPC ...... H04N 25/621; H04N 25/11; H04N 25/10; H04N 25/13; H04N 25/133; H04N 25/134; H04N 25/135; H04N 25/136; H10F 39/182; H10F 39/186
See application file for complete search history.

(56) References Cited

U.S. PATENT DOCUMENTS

| | | | | |
|---|---|---|---|---|
| 9,467,665 | B1 * | 10/2016 | Wang | H04N 25/133 |
| 2016/0205359 | A1 * | 7/2016 | Hirota | H04N 25/13 |
| | | | | 348/280 |
| 2020/0295096 | A1 * | 9/2020 | Min | H04N 25/135 |
| 2022/0256127 | A1 * | 8/2022 | Sakamoto | H04N 25/133 |

OTHER PUBLICATIONS

Keigo Hirakawa, Patrick J. Wolfe, Spatio-Spectral Color Filter Array Design for Optimal Image Recovery, IEEE Transactions on Image Processing, Oct. 2008, pp. 1876-1890, vol. 17, No. 10, IEEE, USA.

Mrityunjay Kumar, Efrid O. Morales, James E. Adams Jr., Wei Hao, New Digital Camera Sensor Architecture for Low Light Imaging, 2009 16th IEEE International Conference on Image Processing (ICIP), Nov. 7-10, 2009, pp. 2681-2684, IEEE, USA.

* cited by examiner

*Primary Examiner* — Kelly L Jerabek

(57) ABSTRACT

An image sensor comprises a pixel array having a color filter array including a minimal repeating unit, where the minimal repeating unit consists of 4×4 pixels including two red pixels, four green pixels, two blue pixels, and eight clear pixels. When clear pixels are saturated and blooming, a blue pixel is affected by three or two clear pixels, but not four clear pixels.

3 Claims, 13 Drawing Sheets

MINIMAL REPEATING UNIT HAVING REDUCED BLOOMING EFFECT OF CLEAR PIXELS

FIELD OF THE INVENTION

This invention relates to an image sensor pixel array having a minimal repeating unit, and more specifically relates to an image sensor pixel array having a minimal repeating unit that reduces the blooming effect of clear pixels.

BACKGROUND OF THE INVENTION

Image sensors can capture color images by combining a pixel array of photosensitive pixels with a set of color filters. Each pixel in the pixel array is coupled to a filter that removes all but a particular wavelength—that is, a particular color of light—from the light incident on the image sensor. As a result, each pixel in the pixel array captures light of a single color, and for each pixel the color values for the other colors are interpolated.

A RGBC pattern is a CFA (color filter array) designed for image quality enhancement under low light conditions. Because of the higher optical transmittance of clear (C) pixels over conventional red (R), green (G), and blue (B) pixels, the signal-to-noise ratio (SNR) of images captured by this type of sensor increases significantly, thus boosting the image quality, especially under low light conditions. Recently, smartphone manufacturers have adopted RGBC sensors in their flagship products to improve the camera image quality.

On the other hand, C pixels have no color filters covering photodiodes, therefore their photodiodes may be saturated faster than RGB pixels. When C pixel is saturated and becomes blooming, the excess charges may overflow into the adjacent pixels resulting in poor quality images.

Accordingly, new types of RGBC patterns are demanded to reduce the effect of the blooming of C pixels on the adjacent RGB pixels.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3A shows a CFA known as Kodak Version 1.

FIG. 3B shows a CFA known as Kodak Version 2.

FIG. 5C shows an exemplary CFA including a minimal repeating unit, in accordance with an embodiment of the present invention.

FIG. 5D shows a minimal repeating unit, which further represents minimal repeating unit shown in FIG. 5C, in accordance with an embodiment of the present invention.

FIG. 5E shows a minimal repeating unit, which is a mirror image of minimal repeating unit shown in FIG. 5D, in accordance with an embodiment of the present invention.

FIG. 6C shows an exemplary CFA including a minimal repeating unit, in accordance with an embodiment of the present invention.

FIG. 6D shows a minimal repeating unit, which further represents minimal repeating unit shown in FIG. 6C, in accordance with an embodiment of the present invention.

FIG. 6E shows a minimal repeating unit, which is a mirror image of minimal repeating unit shown in FIG. 6D, in accordance with an embodiment of the present invention.

FIG. 7C shows an exemplary CFA including a minimal repeating unit, in accordance with an embodiment of the present invention.

FIG. 7D shows a minimal repeating unit, which further represents minimal repeating unit shown in FIG. 7C, in accordance with an embodiment of the present invention.

FIG. 7E shows a minimal repeating unit, which is a mirror image of minimal repeating unit shown in FIG. 7D, in accordance with an embodiment of the present invention.

Figure 1:
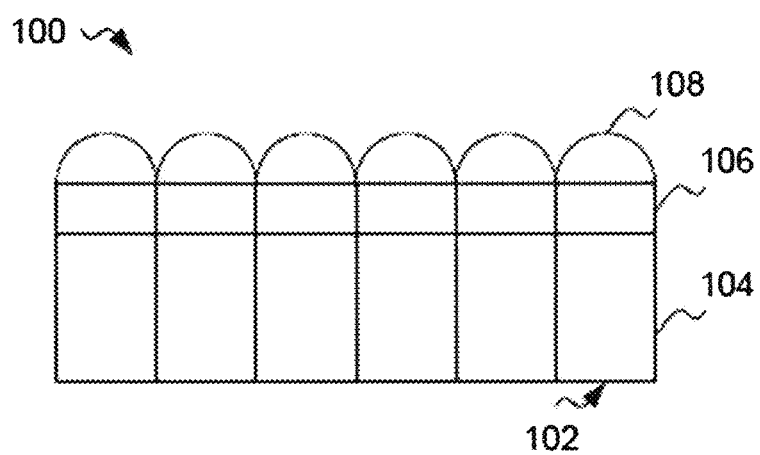
FIG. 1 shows a cross-section view of a pixel array of an image sensor.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

FIG. 1 shows a cross-section view of a pixel array 100 of an image sensor including a plurality of pixels 102. The image sensor comprises pixel array 100. Each pixel 102 comprises a photodiode 104, a color filter 106, and a microlens 108. Pixel 102 may have other elements not shown in the drawing. Alternatively, a microlens 108 may cover 2×2 pixels 102 instead of only one pixel (not shown). Also, a microlens 108 may cover two, three, or any number of pixels 102 in various arrangements (not shown). Color filter 106 may be red (R), green (G), or blue (B) color filter. Pixel 102 may have no color filter or a filter that passes all wavelengths of light. These pixels may be referred as pixels having clear (C) color filters. Generally, a CFA comprises R, G, B, and C filters 106, under microlenses 108, covering photodiodes 104 in pixel array 100. Pixels having red color filters may be referred as R pixels. Pixels having green color filters may be referred as G pixels. Pixels having blue color filters may be referred as B pixels. Pixels having clear color filters may be referred as C pixels.

Figure 2:
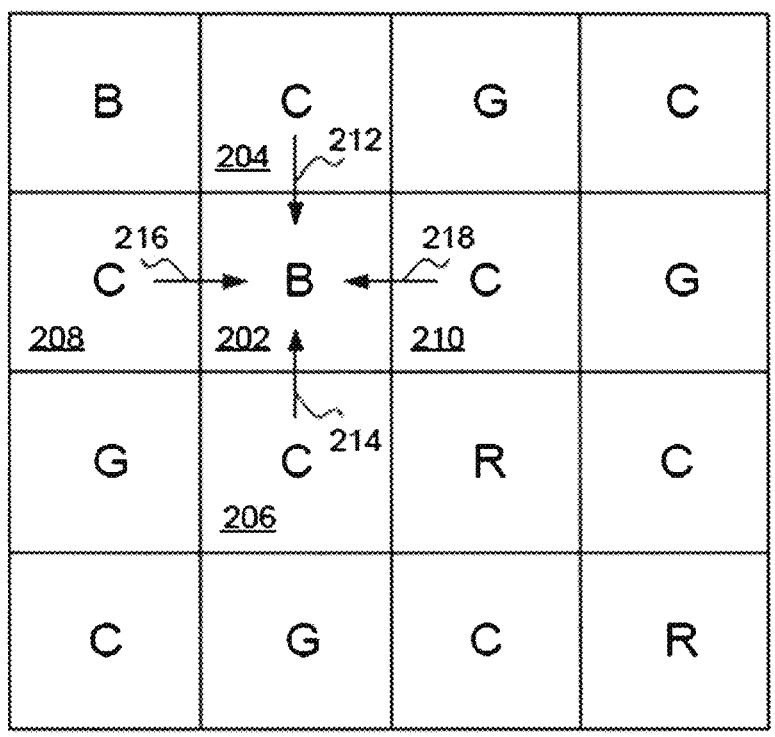
FIG. 2 shows a minimal repeating unit of a CFA comprising a standard 4×4 RGBC pattern.

FIG. 2 shows a minimal repeating unit 200 comprising a standard 4×4 RGBC pattern. A CFA comprises a minimal repeating unit, such as minimal repeating unit 200. A minimal repeating unit is immediately next to another minimal repeating unit in row and column directions. A minimal repeating unit is a repeating unit such that no other repeating unit has fewer individual pixels. A CFA of a pixel array can include several different repeating units, but a repeating unit is not a minimal repeating unit if there is another repeating unit in the pixel array includes fewer individual pixels. The flowing of excess charges into B pixel 202 in minimal repeating unit 200 results in poor quality images produced by the camera.

When C pixels are blooming, each RGB pixel is affected by the blooming of four C pixels from four directions. For example, a B pixel 202 is affected by the neighboring blooming C pixels. An overflow of excess charges 212 flows from C pixel 204 to B pixel 202. An overflow of excess charges 214 flows from C pixel 206 to B pixel 202. An overflow of excess charges 216 flows from C pixel 208 to B pixel 202. An overflow of excess charges 218 flows from C pixel 210 to B pixel 202.

To prevent the excess charges of C pixels overflowing to the adjacent RGB pixels, some solutions may be provided such as, (1) lowering overflow barrier to floating diffusion (FD) by implantation, but it may reduce the full well capacity, (2) increase isolation barrier by more isolation doping, but it may also reduce full well capacity, and (3) making deeper deep-trench isolation (DTI) to cut blooming path, but deeper DTI can be source of white pixel or dark current, and has difficulty in process control.

The present invention does not alter the physical layer of the substrate under the CFA. Instead, the color filter arrangement of the CFA is altered. However, the total number of RGBC pixels in a minimal repeating unit are unchanged. A minimal repeating unit has two R pixels, four G pixels, two B pixels, and eight C pixels.

Figures 3A, 3B:
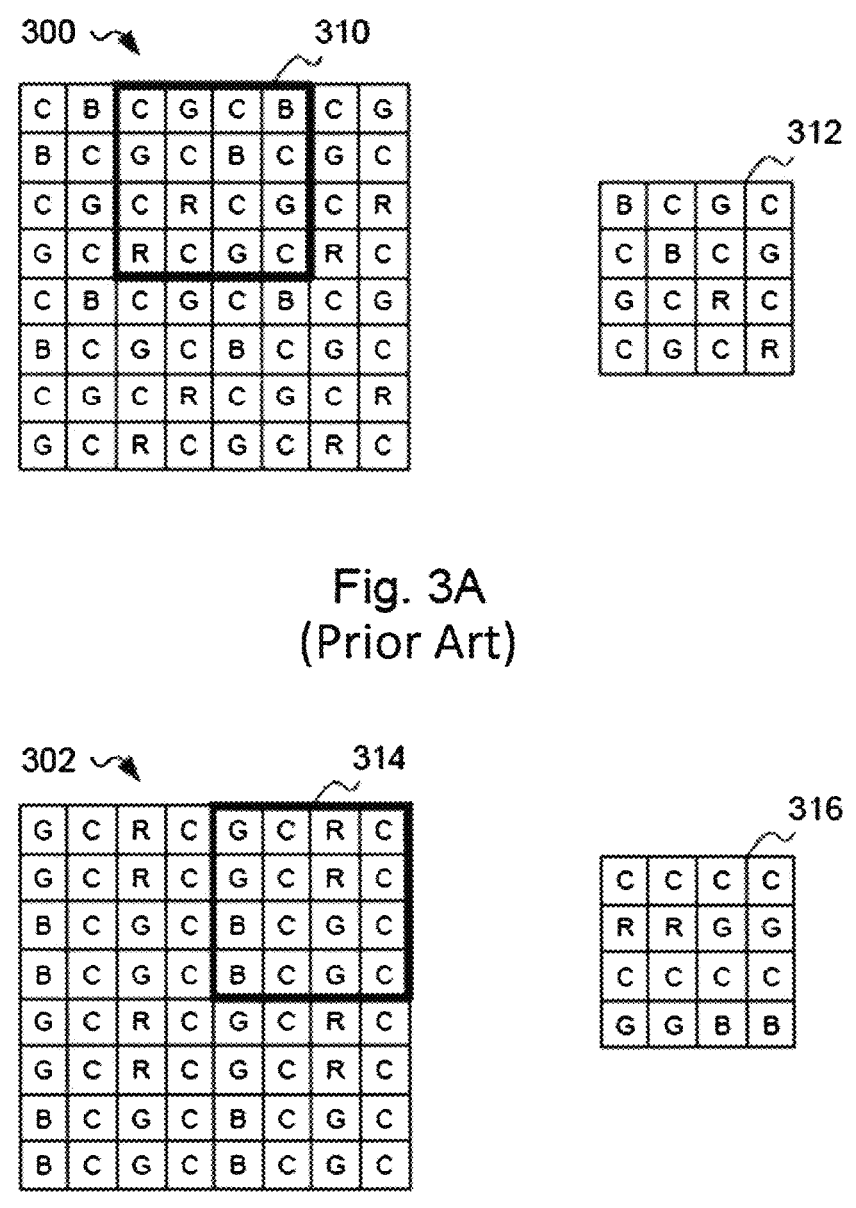

FIG. 3A shows a CFA 300 known as Kodak Version 1. CFA 300 includes a 4×4 minimal repeating unit 310. A minimal repeating unit 312 is a mirror image of minimal repeating unit 310. They are equivalent. Minimal repeating unit 312 is same as minimal repeating unit 200 shown in FIG. 2.

FIG. 3B shows a CFA 302 known as Kodak Version 2. CFA 302 includes a 4×4 minimal repeating unit 314. A minimal repeating unit 316 is a 90 degree left-rotated minimal repeating unit 314. They are equivalent.

Figure 3C:
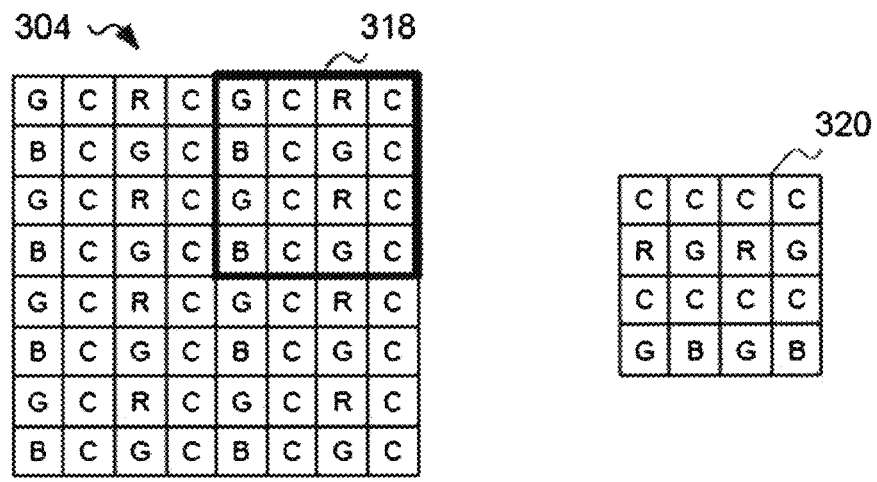
FIG. 3C shows a CFA known as Kodak Version 3.

FIG. 3C shows a CFA 304 known as Kodak Version 3. CFA 304 includes a 4×4 minimal repeating unit 318. A minimal repeating unit 320 is a 90 degree left-rotated minimal repeating unit 318. They are equivalent.

Figure 4:
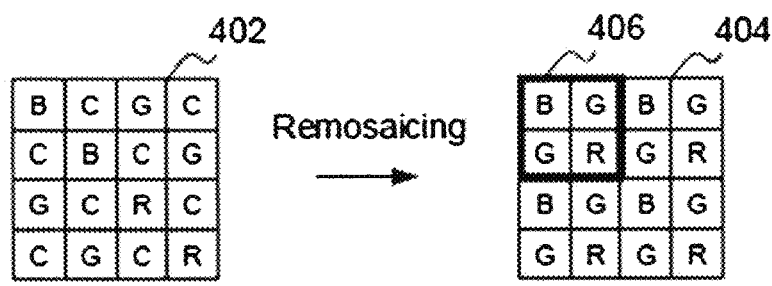
FIG. 4 shows a minimal repeating unit being remosaiced or converted into a Bayer pattern.

Standard camera can only work with Bayer patterns. Thus an interpolation procedure known as remosaicing is needed to convert the minimal repeating unit, e.g., minimal repeating unit 312, of the RGBC image sensor into a Bayer pattern. FIG. 4 conceptually shows a minimal repeating unit 402 being remosaiced or converted into a Bayer pattern 404. A 4×4 Bayer pattern 404 has four R pixels, eight G pixels, and four B pixels. A basic 2×2 Bayer pattern 406 has one R pixel, two G pixels, and one B pixel.

A good remosaicing algorithm should be able to get a Bayer output from RGBC with the least artifacts and to fully take advantage of the SNR and resolution benefit of C pixels. Particular remosaicing algorithms are not discussed in this disclosure. However, raw data from a RGBC image sensor, which is less corrupted by the blooming of C pixels, would provide better quality images from the camera.

Figure 5A:
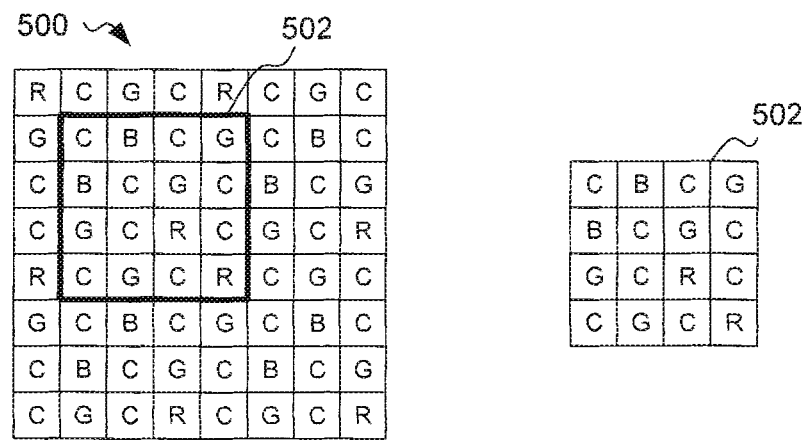
FIG. 5A shows an exemplary CFA including a minimal repeating unit, in accordance with an embodiment of the present invention.

FIG. 5A shows an exemplary CFA 500 including a minimal repeating unit 502, in accordance with an embodiment of the present invention.

Figure 5B:
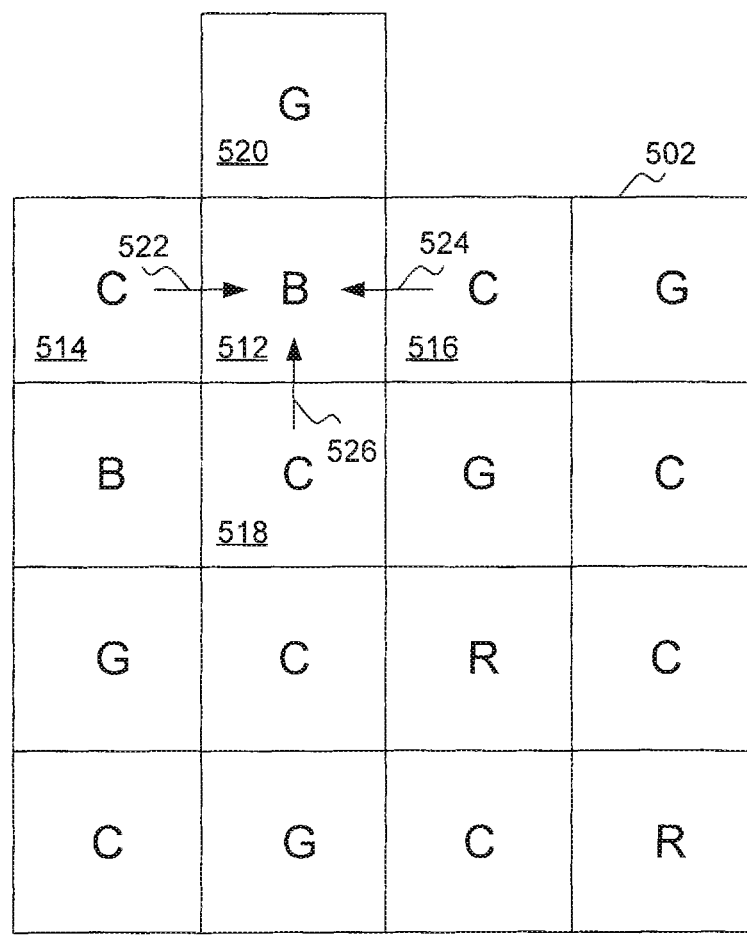
FIG. 5B shows an example when C pixels are blooming, a B pixel in minimal repeating unit is affected by neighboring blooming C pixels, in accordance with an embodiment of the present invention.

FIG. 5B shows an example when C pixels are blooming, a B pixel 512 in minimal repeating unit 502 is affected by the neighboring blooming C pixels, in accordance with an embodiment of the present invention. An overflow of excess charges 522 flows from C pixel 514 to B pixel 512. An overflow of excess charges 524 flows from C pixel 516 to B pixel 512. An overflow of excess charges 526 flows from C pixel 518 to B pixel 512. Another neighboring pixel, which is G pixel 520, contributes no or less overflow of excess charges to B pixel 512. G pixel 520 is a pixel from a neighboring minimal repeating unit not belonging to minimal repeating unit 502.

Thus B pixel 512 receives only three overflows of excess charges from C pixels 514, 516, and 518. Comparing to B pixel 202 of FIG. 2 receiving four overflows of excess charges, minimal repeating unit 502 has reduced effect caused by C pixel blooming.

Figures 5C, 5D, 5E:
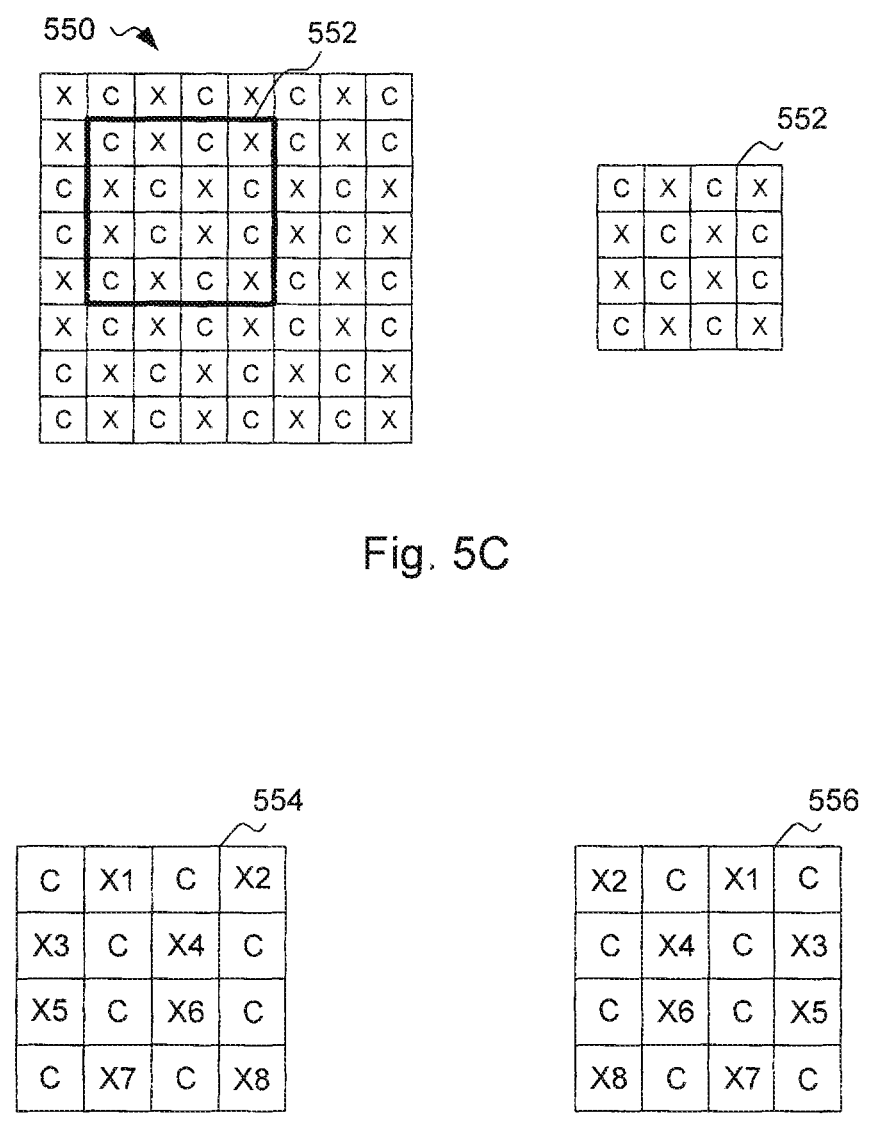

FIG. 5C shows an exemplary CFA 550 including a minimal repeating unit 552, in accordance with an embodiment of the present invention. X pixels of CFA 550 can be R pixels, G pixels, or B pixels. There are two R pixels, four G pixels, and two B pixels in minimal repeating unit 552. Each X pixel has three neighboring C pixels. When C pixels are blooming, each X pixel is affected by three neighboring C pixels. Comparing to B pixel 202 of FIG. 2 receiving four overflows of excess charges, minimal repeating unit 552 has reduced effect caused by C pixel blooming.

FIG. 5D shows a minimal repeating unit 554, which further represents minimal repeating unit 552, in accordance with an embodiment of the present invention. X1 and X3 may be B pixels, X2, X4, X5 and X7 may be G pixels, and X6 and X8 may be R pixels. In this case, minimal repeating unit 554 is same as minimal repeating unit 502. This arrangement may provide a better remosaiced Bayer pattern in terms of artifact, resolution, and SNR. Alternatively, following similar analysis, X1 and X3 may be R pixels, X2, X4, X5 and X7 may be G pixels, and X6 and X8 may be B pixels.

FIG. 5E shows a minimal repeating unit 556, which is a mirror image of minimal repeating unit 554, in accordance with an embodiment of the present invention. X1 and X3 may be B pixels, X2, X4, X5 and X7 may be G pixels, and X6 and X8 may be R pixels. The same analysis is applied to minimal repeating unit 556 as well as minimal repeating unit 554. Similarly, X1 and X3 may be R pixels, X2, X4, X5 and X7 may be G pixels, and X6 and X8 may be B pixels.

Figure 6A:
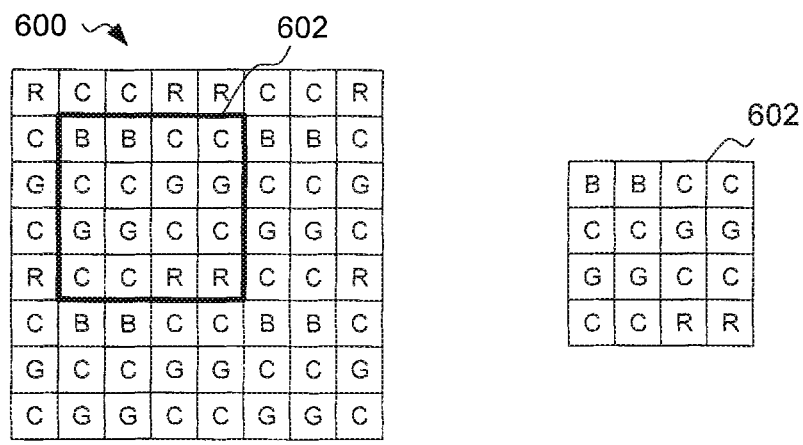
FIG. 6A shows an exemplary CFA including a minimal repeating unit, in accordance with an embodiment of the present invention.

FIG. 6A shows an exemplary CFA 600 including a minimal repeating unit 602, in accordance with an embodiment of the present invention.

Figure 6B:
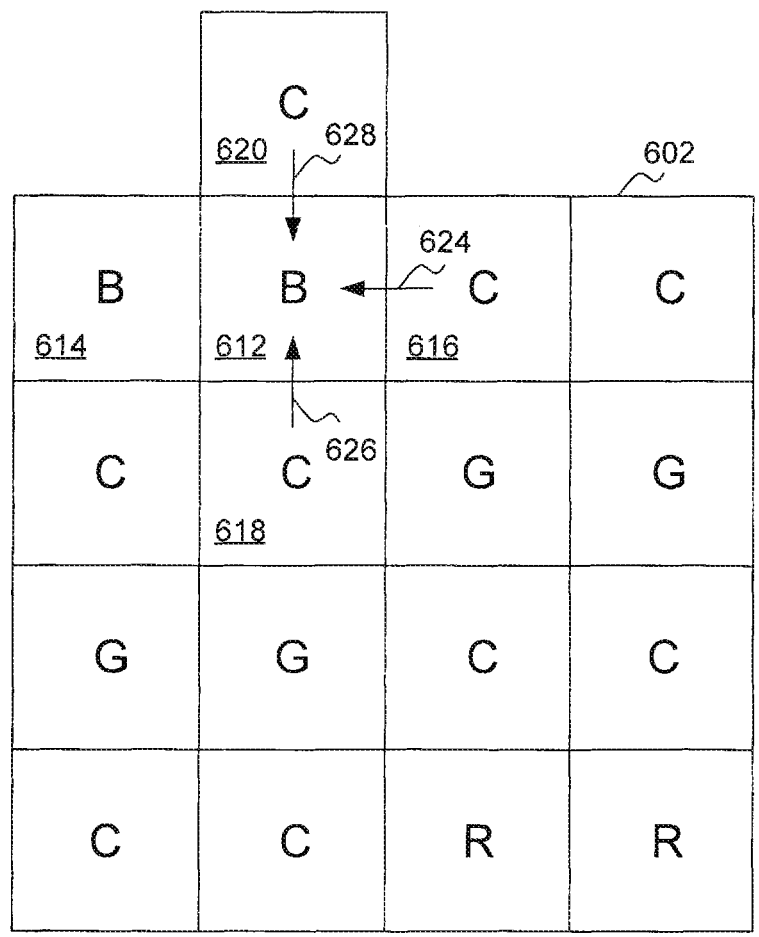
FIG. 6B shows an example when C pixels are blooming, a B pixel in minimal repeating unit is affected by neighboring blooming C pixels, in accordance with an embodiment of the present invention.

FIG. 6B shows an example when C pixels are blooming, a B pixel 612 in minimal repeating unit 602 is affected by the neighboring blooming C pixels, in accordance with an embodiment of the present invention. An overflow of excess charges 624 flows from C pixel 616 to B pixel 612. An overflow of excess charges 626 flows from C pixel 618 to B pixel 612. An overflow of excess charges 628 flows from C pixel 620 to B pixel 612. Another neighboring pixel, which is B pixel 614, contributes no or less overflow of excess charges to B pixel 612. C pixel 620 is a pixel from a neighboring minimal repeating unit not belonging to minimal repeating unit 602.

Thus B pixel 612 receives only three overflows of excess charges from C pixels 616, 618, and 620. Comparing to B pixel 202 of FIG. 2 receiving four overflows of excess charges, minimal repeating unit 602 has reduced effect caused by C pixel blooming.

Figures 6C, 6D, 6E:
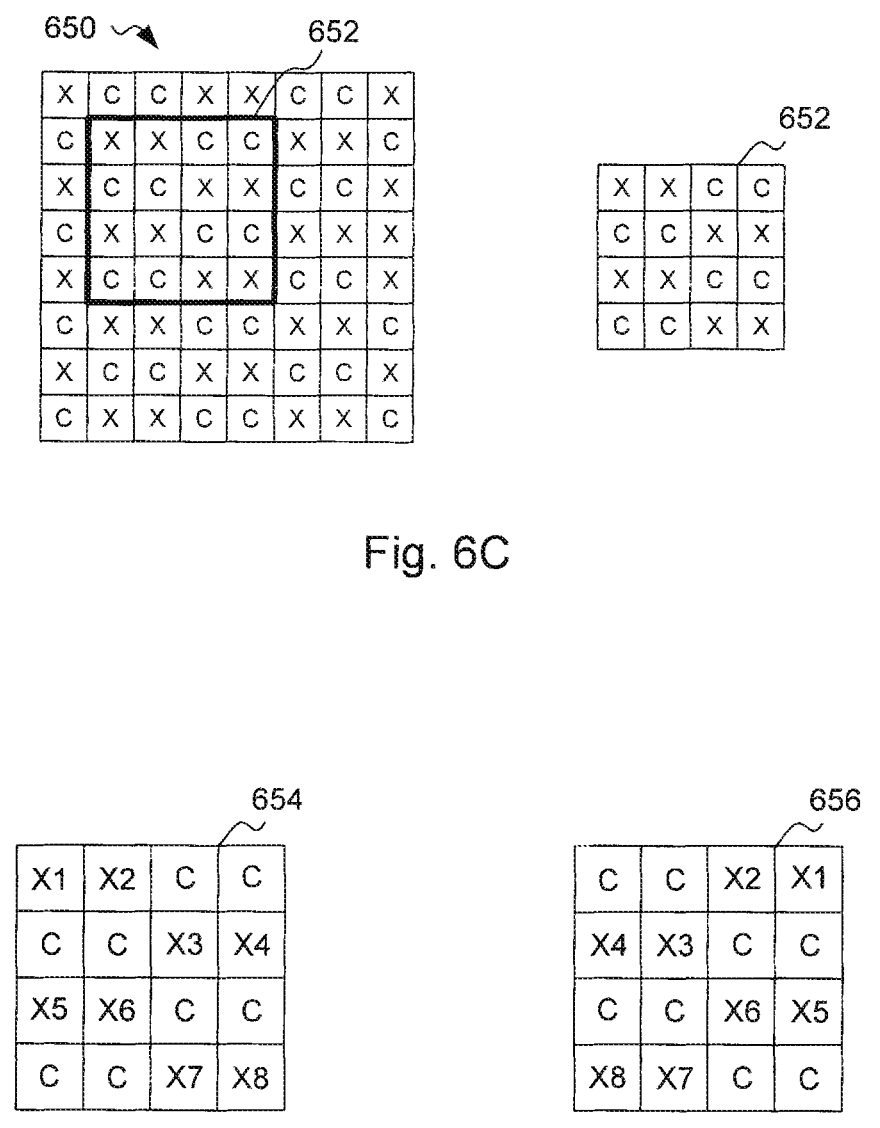

FIG. 6C shows a CFA 650 including a minimal repeating unit 652, in accordance with an embodiment of the present invention. X pixels of CFA 650 can be R pixels, G pixels, or B pixels. There are two R pixels, four G pixels, and two B pixels in minimal repeating unit 652. Each X pixel has three neighboring C pixels. When C pixels are blooming, each X pixel is affected by three neighboring C pixels, including a C pixel not belonging to minimal repeating unit 652. Comparing to B pixel 202 of FIG. 2 receiving four overflows of excess charges, minimal repeating unit 652 has reduced effect caused by C pixel blooming.

FIG. 6D shows a minimal repeating unit 654, which further represents minimal repeating unit 652, in accordance with an embodiment of the present invention. X1 and X2 may be B pixels, X3, X4, X5 and X6 may be G pixels, and X7 and X8 may be R pixels. In this case, minimal repeating unit 654 is same as minimal repeating unit 602. This arrangement may provide a better remosaiced Bayer pattern in terms of artifact, resolution, and SNR. Alternatively, following similar analysis, X1 and X2 may be R pixels, X3, X4, X5 and X6 may be G pixels, and X7 and X8 may be B pixels.

FIG. 6E shows a minimal repeating unit 656, which is a mirror image of minimal repeating unit 654, in accordance with an embodiment of the present invention. X1 and X2 may be B pixels, X3, X4, X5 and X6 may be G pixels, and X7 and X8 may be R pixels. The same analysis is applied to minimal repeating unit 656 as well as minimal repeating unit 654. Similarly, X1 and X2 may be R pixels, X3, X4, X5 and X6 may be G pixels, and X7 and X8 may be B pixels.

Figure 7A:
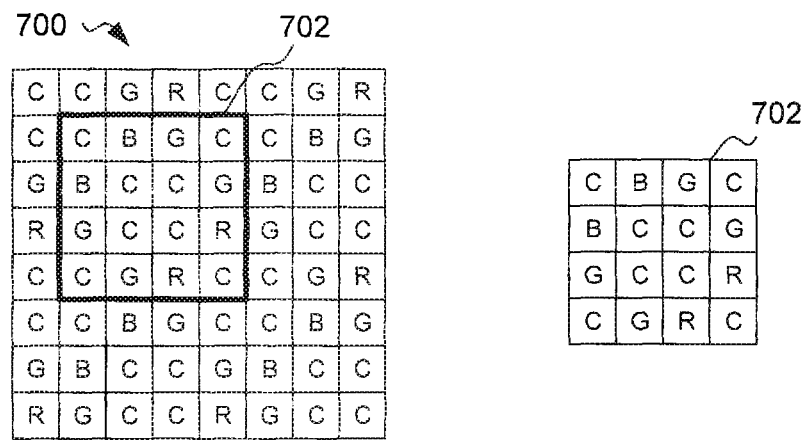
FIG. 7A shows an exemplary CFA including a minimal repeating unit, in accordance with an embodiment of the present invention.

FIG. 7A shows an exemplary CFA 700 including a minimal repeating unit 702, in accordance with an embodiment of the present invention.

Figure 7B:
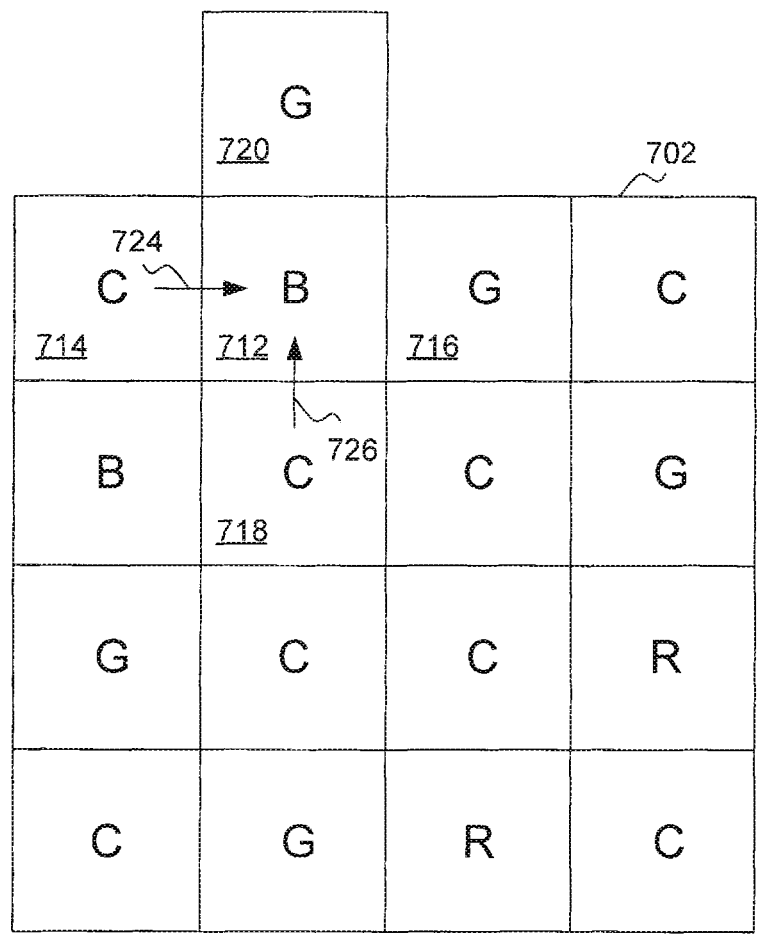
FIG. 7B shows an example when C pixels are blooming, a B pixel in minimal repeating unit is affected by neighboring blooming C pixels, in accordance with an embodiment of the present invention.

FIG. 7B shows an example when C pixels are blooming, a B pixel 712 in minimal repeating unit 702 is affected by the neighboring blooming C pixels, in accordance with an embodiment of the present invention. An overflow of excess charges 724 flows from C pixel 714 to B pixel 712. An overflow of excess charges 726 flows from C pixel 718 to B pixel 712. B pixel 712 has two other neighboring G pixels 716 and 720 contributing no or less overflow of excess charges to B pixel 712. G pixel 720 is a pixel from a neighboring minimal repeating unit not belonging to minimal repeating unit 702.

Thus B pixel 712 receives only two overflows of excess charges from C pixels 714 and 718. Comparing to B pixel 202 of FIG. 2 receiving four overflows of excess charges, minimal repeating unit 702 has reduced effect caused by C pixel blooming.

Figures 7C, 7D, 7E:
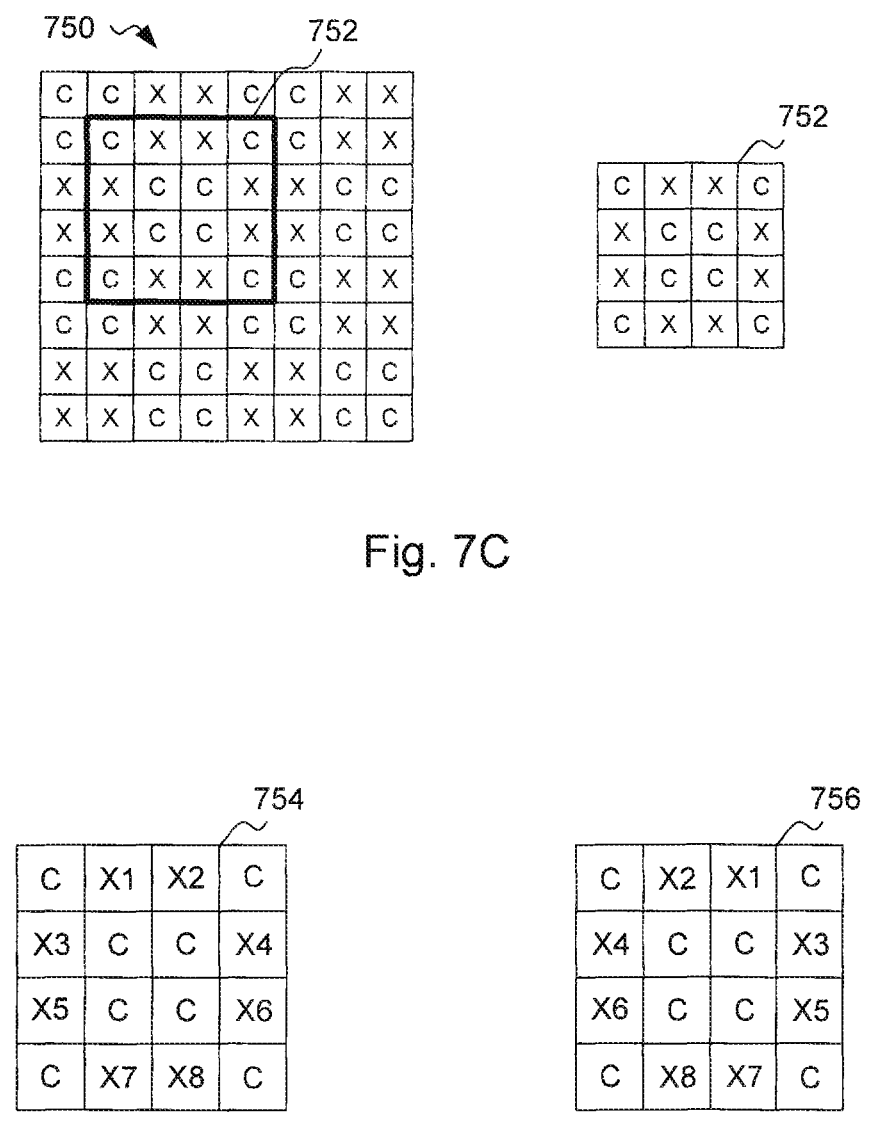

FIG. 7C shows a CFA 750 including a minimal repeating unit 752, in accordance with an embodiment of the present invention. X pixels of CFA 750 can be R pixels, G pixels, or B pixels. There are two R pixels, four G pixels, and two B pixels in minimal repeating unit 752. Each X pixel has two neighboring C pixels. When C pixels are blooming, each X pixel is affected by two neighboring C pixels in minimal repeating unit 752. Comparing to B pixel 202 of FIG. 2 receiving four overflows of excess charges, minimal repeating unit 752 has reduced effect caused by C pixel blooming.

FIG. 7D shows a minimal repeating unit 754, which further represents minimal repeating unit 752, in accordance with an embodiment of the present invention. X1 and X3 may be B pixels, X2, X4, X5 and X7 may be G pixels, and X6 and X8 may be R pixels. In this case, minimal repeating unit 754 is same as minimal repeating unit 702. This arrangement may provide a better remosaiced Bayer pattern in terms of artifact, resolution, and SNR. Alternatively, following similar analysis, X1 and X3 may be R pixels, X2, X4, X5 and X7 may be G pixels, and X6 and X8 may be B pixels.

FIG. 7E shows a minimal repeating unit 756, which is a mirror image of minimal repeating unit 754, in accordance with an embodiment of the present invention. X1 and X3 may be B pixels, X2, X4, X5 and X7 may be G pixels, and X6 and X8 may be R pixels. The same analysis is applied to minimal repeating unit 756 as well as minimal repeating unit 754. Similarly, X1 and X3 may be R pixels, X2, X4, X5 and X7 may be G pixels, and X6 and X8 may be B pixels.

While the present invention has been described herein with respect to the exemplary embodiments and the best mode for practicing the invention, it will be apparent to one of ordinary skill in the art that many modifications, improvements and sub-combinations of the various embodiments, adaptations, and variations can be made to the invention without departing from the spirit and scope thereof.

The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor comprising a pixel array having a color filter array including a minimal repeating unit, wherein the minimal repeating unit consists of 4×4 pixels including 2 red pixels, 4 green pixels, 2 blue pixels, and 8 clear pixels; wherein the minimal repeating unit is:

| C  | X1 | C  | X2  |
|----|----|----|-----|
| X3 | C  | X4 | C   |
| X5 | C  | X6 | C   |
| C  | X7 | C  | X8, | wherein C is clear pixel, and each of X1, X2, X3, X4, X5, X6, X7, and X8 is one of red, green, and blue pixels; and wherein X1, X2, X3, X4, X5, X6, X7, and X8 include 2 red pixels, 4 green pixels, and 2 blue pixels.

2. The image sensor of claim 1, wherein X1 and X3 are blue pixels, X2, X4, X5 and X7 are green pixels, and X6 and X8 are red pixels.

3. The image sensor of claim 1, wherein X1 and X3 are red pixels, X2, X4, X5 and X7 are green pixels, and X6 and X8 are blue pixels.

* * * * *